United States Patent
Kim et al.

(10) Patent No.: US 11,075,644 B2
(45) Date of Patent: Jul. 27, 2021

(54) EFFICIENT ALL-DIGITAL DOMAIN CALIBRATION ARCHITECTURE FOR A SUCCESSIVE APPROXIMATION REGISTER ANALOG-TO-DIGITAL CONVERTER

(71) Applicant: NEWRACOM, Inc., Lake Forest, CA (US)

(72) Inventors: Ryunwoo Kim, Yongin (KR); Seungyun Lee, Irvine, CA (US); Jaeyoung Ryu, Irvine, CA (US); Jeongki Choi, Lake Forest, CA (US); Jonghoon Park, Seoul (KR); Changhun Song, Seoul (KR)

(73) Assignee: NEWRACOM, Inc., Lake Forest, CA (US)

(*) Notice: Subject to any disclaimer, the term of this patent is extended or adjusted under 35 U.S.C. 154(b) by 0 days.

(21) Appl. No.: 16/926,261

(22) Filed: Jul. 10, 2020

(65) Prior Publication Data
US 2021/0013898 A1    Jan. 14, 2021

Related U.S. Application Data

(60) Provisional application No. 62/873,585, filed on Jul. 12, 2019.

(51) Int. Cl.
*H03M 1/10* (2006.01)
*H03M 1/40* (2006.01)

(52) U.S. Cl.
CPC ......... *H03M 1/403* (2013.01); *H03M 1/1033* (2013.01)

(58) Field of Classification Search
CPC .... H03M 1/403; H03M 1/1033; H03M 3/458; H03M 1/1023; H03M 1/12; H03M 1/1245; H03M 1/462; H03M 1/1009; H03M 1/1038; H03M 1/468; H03M 1/00; H03M 1/08; H03M 1/1057; H03M 1/46; H03M 1/06; H03M 1/0626; H03M 1/1071
USPC .......................... 341/110, 118–121, 131, 140
See application file for complete search history.

(56) References Cited

U.S. PATENT DOCUMENTS

| | | | |
|---|---|---|---|
| 7,522,077 B1 * | 4/2009 | Itkin | H03M 1/1028 341/118 |
| 9,325,337 B1 * | 4/2016 | Dempsey | H03M 1/109 |
| 9,945,901 B1 * | 4/2018 | Otte | H03M 1/109 |
| 2007/0080841 A1 * | 4/2007 | Raphaeli | H03M 1/72 341/155 |
| 2011/0227770 A1 * | 9/2011 | Kaper | H03M 1/1052 341/120 |
| 2013/0106632 A1 * | 5/2013 | Petigny | H03M 1/1009 341/120 |
| 2014/0253352 A1 * | 9/2014 | Oshima | H03M 1/0639 341/118 |

(Continued)

*Primary Examiner* — Linh V Nguyen
(74) *Attorney, Agent, or Firm* — NDWE LLP

(57) ABSTRACT

A method is described that is performed by a calibration system. The method includes determining a set of perturbation values for configuring an analog-to-digital converter of the calibration system; generating a set of digital test values for determining the accuracy of the analog-to-digital converter; and applying the set of perturbation values to the set of digital test values to generate a set of modified test values, wherein the set of perturbation values are digital values that are applied to the set of digital test values in the digital domain.

18 Claims, 10 Drawing Sheets

(56) References Cited

U.S. PATENT DOCUMENTS

| | | | | |
|---|---|---|---|---|
| 2014/0333459 A1* | 11/2014 | Oshima | ............... | H03M 1/1052 |
| | | | | 341/120 |
| 2015/0188555 A1* | 7/2015 | Kimura | ................. | H03M 1/002 |
| | | | | 341/118 |
| 2015/0381192 A1* | 12/2015 | Yamamoto | .......... | H03M 1/0609 |
| | | | | 341/120 |
| 2017/0179975 A1* | 6/2017 | Dong | .................... | H03M 3/388 |

\* cited by examiner

EFFICIENT ALL-DIGITAL DOMAIN CALIBRATION ARCHITECTURE FOR A SUCCESSIVE APPROXIMATION REGISTER ANALOG-TO-DIGITAL CONVERTER

CROSS-REFERENCE TO RELATED APPLICATION

This application claims the benefit of U.S. Provisional Patent Application No. 62/873,585, filed Jul. 12, 2019, which is incorporated by reference herein in its entirety.

TECHNICAL FIELD

The present disclosure generally relates to an analog-to-digital converter (ADC), and more specifically, relates to an efficient all-digital domain calibration architecture for a successive approximation register (SAR) ADC.

BACKGROUND ART

Various electronic systems can include analog-to-digital converters (ADCs). Converting analog signals to digital values/quantities can allow processors in electronic systems to perform signal processing functions. For example, an ADC may convert sound picked up by a microphone or light entering a digital camera into a digital signal. An ADC may also provide an isolated measurement such as an electronic device that converts an input analog voltage or current to a digital number representing the magnitude of the voltage or current. Performance of ADC circuits can depend on numerous factors, including environmental conditions (e.g., temperature) and on variable conditions that can occur during manufacture. High accuracy ADC circuits may need calibration multiple times during their working life to avoid errors.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
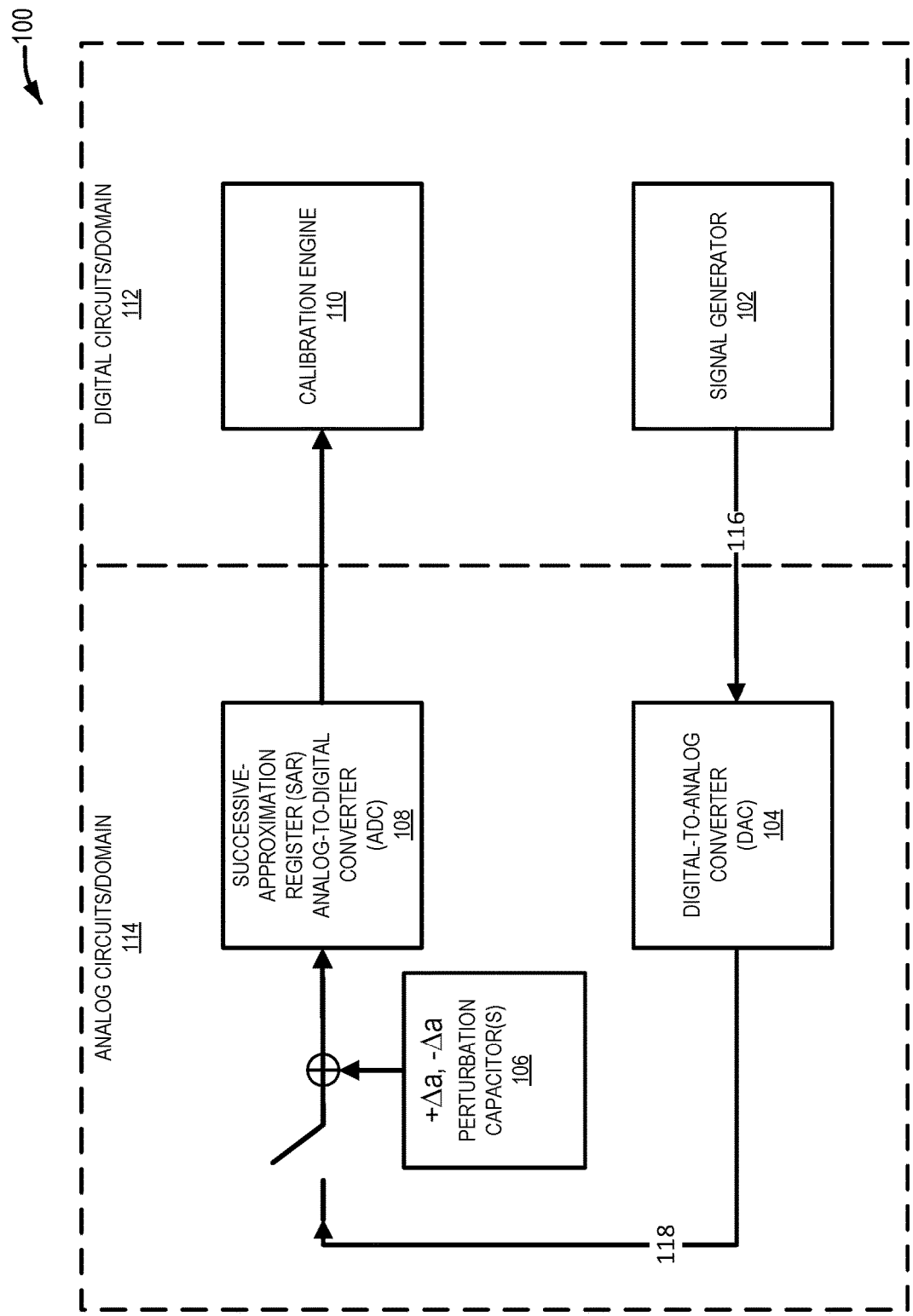
FIG. 1 illustrates an example analog-to-digital converter (ADC) calibration system, in accordance with some embodiments of the present disclosure.

The present disclosure generally relates to analog-to-digital converters (ADCs), and more specifically, relates to an efficient all-digital domain calibration architecture for a successive approximation register (SAR) ADC.

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 shows an ADC calibration system 100, according to one example embodiment. As shown, the ADC calibration system includes a signal generator 102, a digital-to-analog converter (ADC) 104, a perturbation capacitor(s) 106, a successive approximation register (SAR) analog-to-digital converter (DAC) 108, and a calibration engine 110 (sometimes referred to as a calibration circuit 110). As shown in FIG. 1, the signal generator 102 and the calibration engine 110 operate in the digital domain 112 while the ADC 104, perturbation capacitor 106, and the SAR ADC 108 operate in the analog domain 114. The ADC calibration system 100 will be described by way of example below.

In one embodiment, the signal generator 102 may generate a sequence of one or more digital test values 116 (sometimes referred to as test signals 116 or test values 116). For example, the signal generator 102 may generate a sequence of N digital binary values (i.e., the values $B_0$, $B_1$, $B_2$, ... $B_{N-1}$). Each binary value may comprise a single binary value (i.e., a single bit value) or multiple binary values (e.g., two or more bit values). In some embodiments, the signal generator 102 is a pseudo random number generator configured to generate a pseudo random sequence of digital values 116. In other embodiments, the signal generator 102 is a true random number generator that is configured to generate a random sequence of bit values 116. In some embodiments, the signal generator 102 is a linear feedback shift register (LFSR). In some embodiments, the signal generator 102 generates sets of binary values $B_0$-$B_{N-1}$ in succession such that each bit value $B_x$ is paired with an identical bit value $B_x$. Accordingly, the signal generator 102 may generate a sequence of 2N digital binary values (i.e., the values $B_0$, $B_0$, $B_1$, $B_1$, $B_2$, $B_2$, ... $B_{N-1}$, $B_{N-1}$) for use in testing and configuring the accuracy of the SAR ADC 108. As shown in FIG. 1, the signal generator 102 delivers/transfer/passes/transmits the digital values 116 to the DAC 104.

The DAC 104 converts the digital values 116 from the digital domain 112 to the analog values 118 (sometimes referred to as a set of analog test values 118) in the analog domain 114. The DAC 104 generates a number of analog values 118 corresponding to the number of digital values 104. Thus, if there are N digital values 116, the DAC 104 generates N analog values 118. Similarly, if there are 2N digital values 116, the DAC 104 generates 2N analog values 118, which will be utilized for testing and calibrating the SAR ADC 108.

The DAC 104 may utilize various architectures and/or designs for performing digital-to-analog conversions. For example, the DAC 104 may be a pulse-width modulation (PWM) DAC, a binary-weighted DAC, an oversampling or interpolating (e.g., delta-sigma) DAC, an R-2R ladder DAC, a successive-approximation (or cyclic) DAC, a thermometer-coded DAC, etc. Digital-to-analog conversions by the DAC 104 may be achieved by adjusting a particular parameter (e.g., a voltage, a current, etc.) based on input binary data.

As shown in FIG. 1, the analog values 118 from the DAC 104 are delivered/transmitted to the perturbation capacitor(s) 106. In one embodiment that utilizes Offset Double Conversion (ODC), perturbation capacitors 106 are analog hardware structures/elements that are used to calibrate capacitor mismatch of the SAR ADC 108. In particular, a set of perturbation capacitors 106 add/subtract the perturbation value $\Delta a$ to/from the analog values 118, where $+\Delta a$ indicates that the perturbation value $\Delta a$ is added to one or more of the analog values 118 (i.e., the input to the ADC 108) and $-\Delta a$ indicates that the perturbation value $\Delta a$ is subtracted from one or more of the analog values 118. In one embodiment, the calibration engine 110 can calibrate capacitor mismatch of the SAR ADC 108 by adjusting the perturbation values $+\Delta a$ and $-\Delta a$ of the perturbation capacitor(s) 106 using various techniques. For example, the calibration engine 110 may use a LMS (Least Mean Square) algorithm for adjusting the perturbation values $+\Delta a$ and $-\Delta a$ and calibrating capacitor mismatch of the SAR ADC 108.

Figure 2:
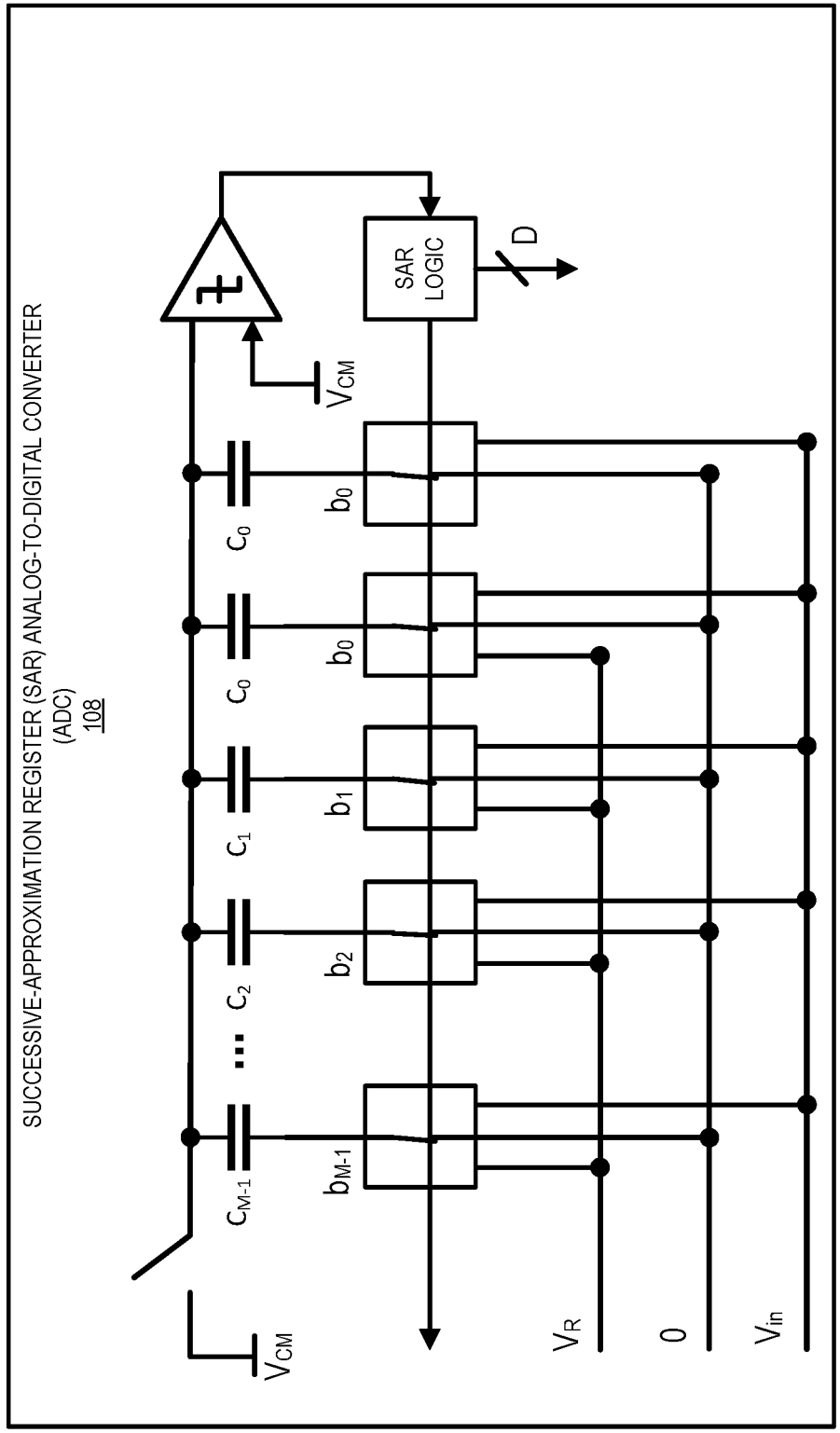
FIG. 2 illustrates an example architecture of a successive approximation register (SAR) ADC, in accordance with some embodiments of the present disclosure.

FIG. 2 shows an architecture of the SAR ADC 108, according to one example embodiment. In particular, the SAR ADC 108 shown in FIG. 2 is binary weighted and utilizes a set of ranked capacitors $C_0$-$C_{M-1}$. In this configuration, the capacitance of each higher-ranked/valued capacitor should be equal to the sum in capacitance of all the lower-rank/value capacitors to avoid a capacitor mismatch issue. For example, to avoid a capacitor mismatch issue the capacitance of the capacitor $C_{M-1}$ should be equal to the sum of the capacitance of the capacitors $C_0$ through $C_{M-2}$. Similarly, the capacitance of the capacitor $C_{M-2}$ should be equal to the sum of the capacitance of the capacitors $C_0$ through $C_{M-3}$ to avoid a capacitor mismatch issue. When the capacitance of any capacitor is not equal (e.g., less than or greater than) to the sum of capacitance of lower ranked/value capacitors, this inequality is indicative of a capacitor mismatch issued of the SAR ADC 108. Avoiding a capacitor mismatch in the SAR ADC 108 enables a binary search for conversion in which the SAR ADC 108 resolves digital bits in clock cycles.

Figure 3A:
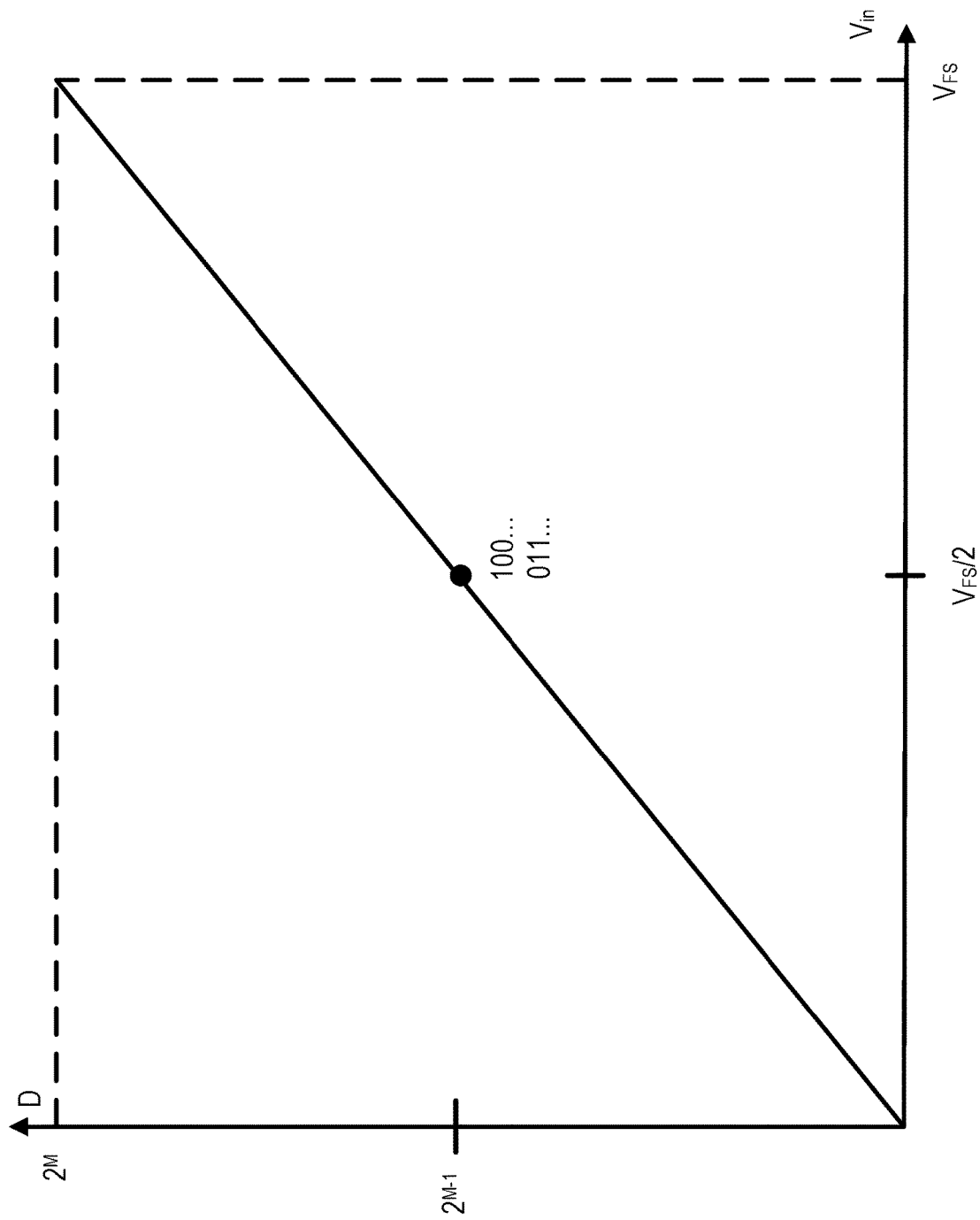
FIG. 3A shows a transfer curve for a SAR ADC without a capacitor mismatch issue, in accordance with some embodiments of the present disclosure.

In an ideal case, as the transfer curve reveals in FIG. 3A, a binary conversion linearly maps analog values to a digital code. For example, an ADC resolves the most significant bit by comparing the analog sample to a reference level at the midpoint of the full range. This level is realized corresponding to either the digital code 10 . . . 0 or 01 . . . 1, which are one least significant bit apart in binary. Upon a decision on the most significant bit, the subsequent search range is then halved. By comparing the input with the middle point of the new search range, the second bit is determined. All digital bits are resolved in this manner until the final digital code is generated. The digital code can be compared by the calibration engine 110 with the original digital values 116 to determine the accuracy of the SAR ADC 108 and potential adjustment of the perturbation values $+\Delta a$ and $-\Delta a$ to calibrate the SAR ADC 108.

Figure 3B:
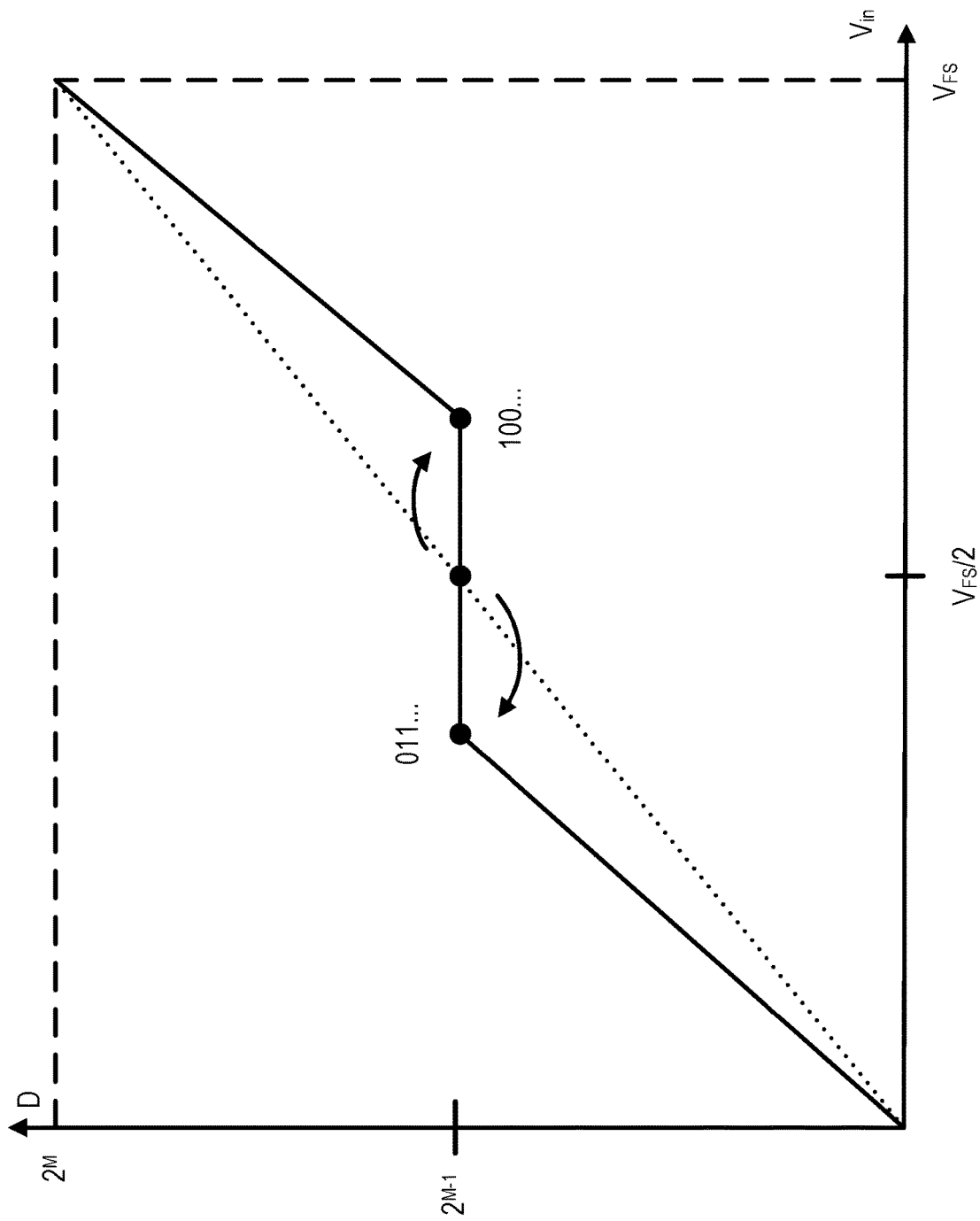
FIG. 3B shows a transfer curve for a SAR ADC with a capacitor mismatch issue in a first scenario, in accordance with some embodiments of the present disclosure.
Figure 3C:
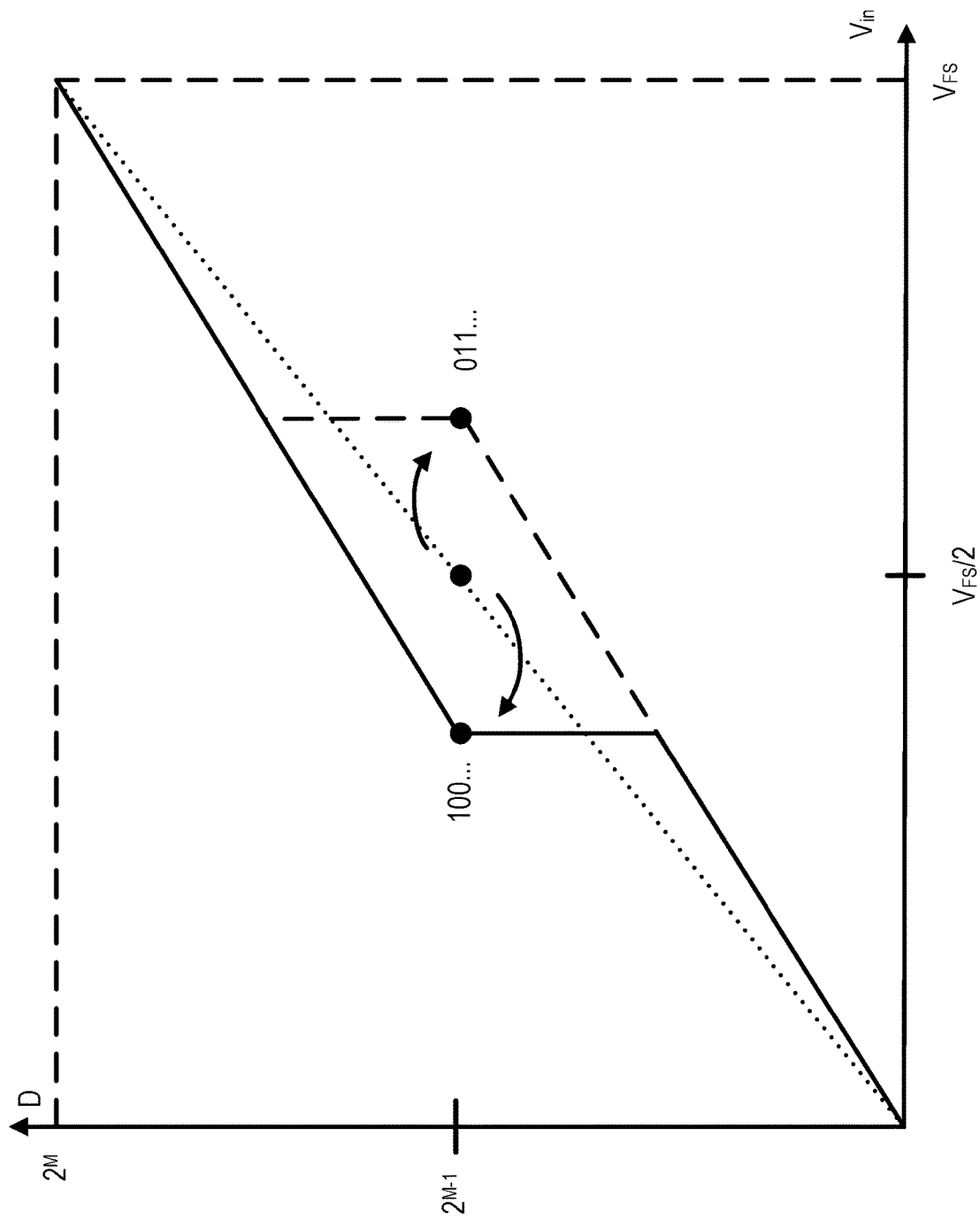
FIG. 3C shows a transfer curve for a SAR ADC with a capacitor mismatch issue in a second scenario, in accordance with some embodiments of the present disclosure.

Although a binary search is most efficient in terms of the number of conversion steps, it is susceptible to various analog impairments in an actual circuit implementation. In particular, capacitor mismatch is the leading error source for binary SAR ADCs. For instance, when the most significant bit capacitor (e.g., capacitor $C_{M-1}$ in the example of FIG. 2) exhibits a capacitor mismatch error (i.e., the capacitance of $C_{M-1}$ is not equal to the sum of capacitances of the capacitors $C_0$-$C_{M-2}$), this makes the most significant bit decision level, corresponding to bit values 10 . . . 0 and 01 . . . 1, to deviate from the midpoint as depicted in FIG. 3B and FIG. 3C. The resulting nonlinearity can be categorized into two scenarios.

FIG. 3B shows a first scenario in which the capacitance of capacitor $C_{M-1}$ is greater than the sum of the other remaining capacitors $C_0$-$C_{M-2}$ (i.e., $C_{M-1} > \Sigma_{x=0}^{M-2} C_x$). This leads to multiple analog input levels mapping to a single digital code. Mapping multiple analog input levels to a single digital code causes direct analog information loss.

In a second scenario, which is shown in FIG. 3C, the capacitance of capacitor $C_{M-1}$ is less than the sum of the other capacitors $C_0$-$C_{M-2}$ (i.e., $C_{M-1} > \Sigma_{x=0}^{M-2} C_x$). This leads to missing codes to be produced by the SAR ADC 108.

Figure 4:
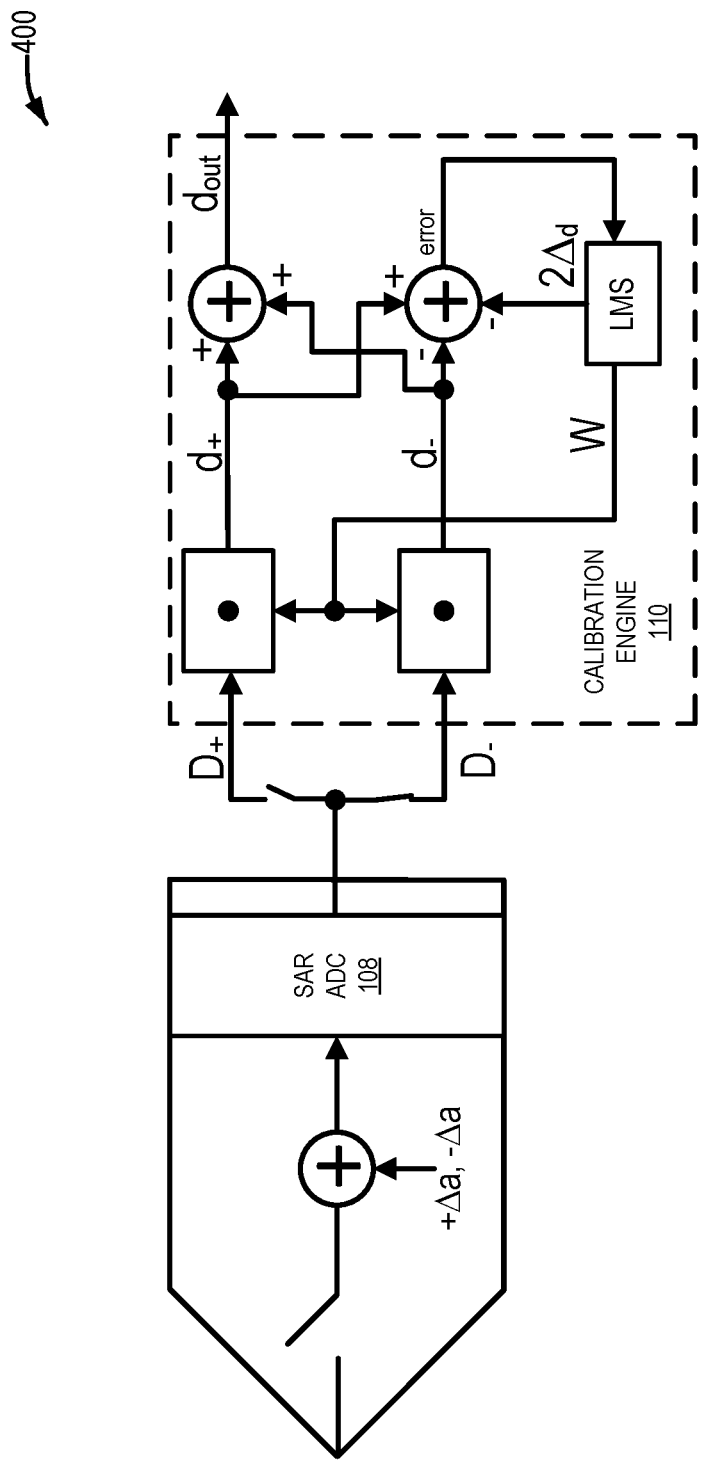
FIG. 4 shows a calibration scheme for a SAR ADC, in accordance with some embodiments of the present disclosure.

FIG. 4 shows a calibration scheme 400 for the SAR ADC 108, according to one example embodiment. As shown in FIG. 4, the SAR ADC 108 digitizes each analog sample twice, with two analog offsets/perturbation values $+\Delta a$ and $-\Delta a$ resulting in two multi-bit (e.g., 14 bit) raw codes $D_+$ and $D_-$, respectively. With the same bit weights, $W=\{w_i, i=0, \ldots, M-1\}$, the calibration engine 110 first calculates the weighted sums of all bits of $D_+$ and $D_-$, denoted as $d_+$ and $d_-$, respectively. The error between the two conversion outputs is then obtained with $2\Delta_d$ digitally removed. With optimal bit weights, this error must be zero, guaranteed by the linearity of the SAR ADC 108.

Although the ADC calibration system 100 may account for capacitor mismatch in the SAR ADC 108, this architecture has a number of drawbacks. In particular, the ADC calibration system 100 requires multiple physical perturbation capacitors (e.g., the perturbation capacitors 106) to apply the perturbation values $+\Delta a$ and $-\Delta a$, which (1) add additional expense to the design of the ADC calibration system 100 as these additional hardware elements (e.g., the perturbation capacitors 106) need to be added and (2) occupy space in an area of the calibration circuit from these hardware elements (e.g., the perturbation capacitors 106). Further, by applying the perturbation values $+\Delta a$ and $-\Delta a$ in the analog domain 114, there is limited precision in generating/setting the perturbation values $+\Delta a$ and $-\Delta a$ to correct/adjust the precision of the SAR ADC 108 by the calibration engine 110.

Figure 5:
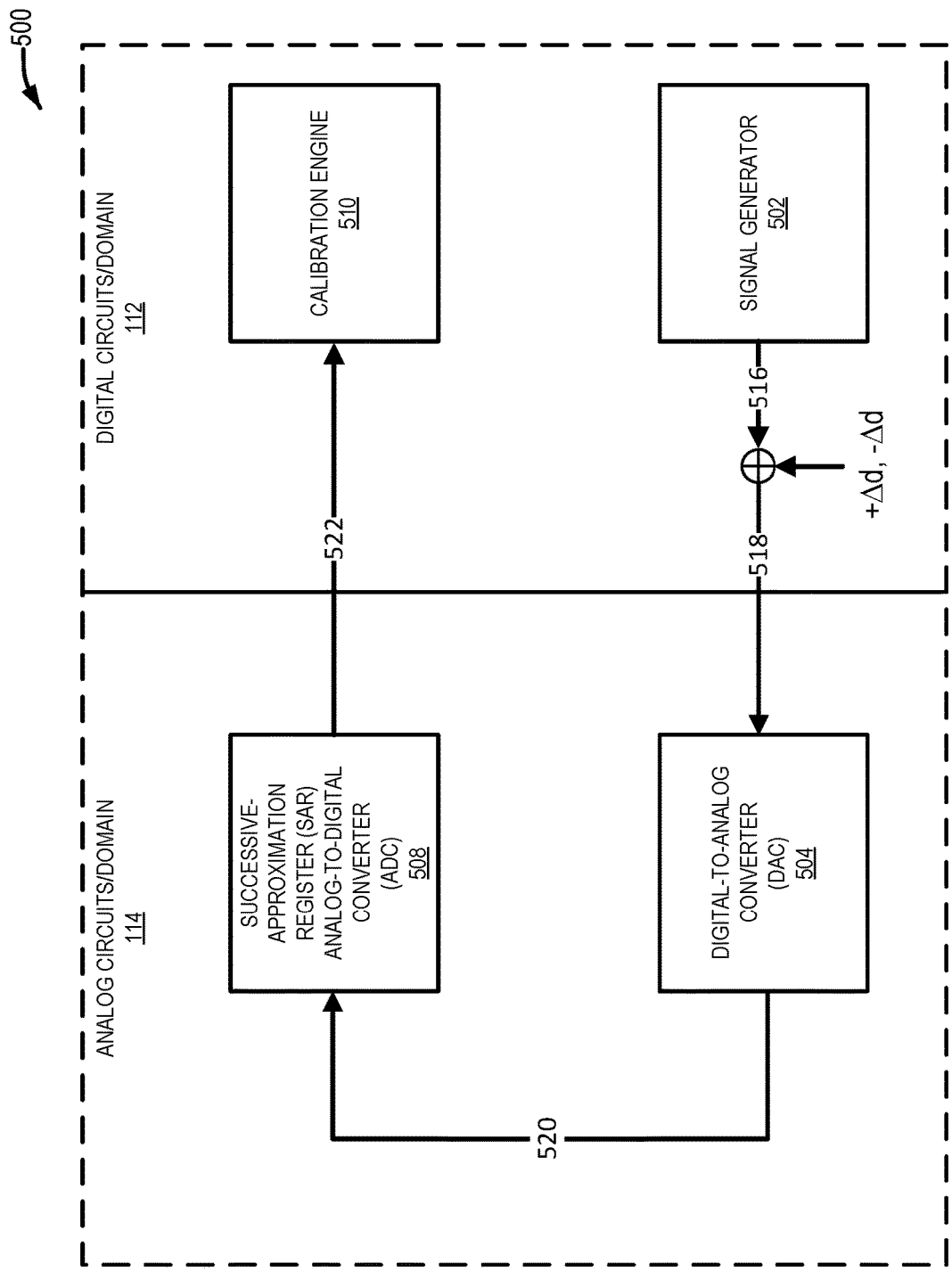
FIG. 5 shows an ADC calibration system, in accordance with some embodiments of the present disclosure.

To correct these and other deficiencies of the ADC calibration system 100 shown in FIG. 1, FIG. 5 presents an ADC calibration system 500, according to another example embodiment. Similar to the ADC calibration system 100, the ADC calibration system 500 may include a signal generator 502, a digital-to-analog converter (ADC) 504, a successive approximation register (SAR) analog-to-digital converter (DAC) 508, and a calibration engine 510 (sometimes referred to as a calibration circuit 510). As shown in FIG. 5, the signal generator 502 and the calibration engine 510 operate in the digital domain 112 while the ADC 504 and the SAR ADC 508 operate in the analog domain 114.

Although similar to the ADC calibration system 100, the ADC calibration system 500 most notably does not include perturbation capacitors 106. Instead, the ADC calibration system 500 adds perturbation values to signals in the digital domain to test and calibrate the accuracy of the SAR ADC 108. The ADC calibration system 500 will be further described by way of example below.

In one embodiment, the signal generator 502 of the ADC calibration system 500 may generate a sequence of one or more digital values 516 (sometimes referred to as test signals 516, test values 516, or digital test values 516). For example, the signal generator 502 may generate a sequence of N digital binary values (i.e., the values $B_0, B_1, B_2, \ldots B_{N-1}$). Each binary value may comprise a single binary value (i.e., a single bit value) or multiple binary values (e.g., two or more bit values). In some embodiments, the signal generator 502 is a pseudo random number generator configured to generate a pseudo random sequence of digital values 516. In other embodiments, the signal generator 502 is a true random number generator that is configured to generate a random sequence of bit values 516. In some embodiments, the signal generator 502 is a linear feedback shift register (LFSR). In some embodiments, the signal generator 502 generates sets of binary values in succession such that each set of binary values $B_x$ is paired with an identical set of binary values $B_x$. Accordingly, the signal generator 502 may generate a sequence of 2N sets of digital binary values (i.e., the values $B_0, B_0, B_1, B_1, B_2, B_2, \ldots B_{N-1}, B_{N-1}$) with pairs of identical values.

In one embodiment, the signal generator 502 or another device/circuit coupled to the signal generator 502 may apply a set of perturbation values $+\Delta d$ and $-\Delta d$ in the digital domain 112 to the digital values 516 to generate a set of modified digital test values 518. In one embodiment, the digital values 516 may be combined with the set of perturbation values $+\Delta d$ and $-\Delta d$ using a combination unit/digital perturbation capacitor (i.e., a perturbation capacitor in the digital domain 112).

As noted above, the digital values 516 may include a repetition of values (e.g., the values $B_0, B_0, B_1, B_1, B_2, B_2, \ldots B_{N-1}, B_{N-1}$). In this embodiment, the perturbation value $+\Delta d$ is applied to the first occurrence of a digital value 516 (i.e., add the perturbation value $\Delta d$ to the digital value 516) and the perturbation value $-\Delta d$ is applied to the second occurrence of the digital value (i.e., subtract the perturbation value $\Delta d$ to the digital value 516). For example, the first occurrence of a digital value 516 would be calculated according to Equation 1, which is shown below.

$$D_x = \frac{(2^{M-1} - pcab)}{2^{M-1}} \times B_x + \Delta d \qquad \text{Equation 1}$$

Equation 1 assumes an M-bit DAC (i.e., the DAC 504 is an M-bit DAC); $B_x$ is the $x^{th}$ digital signal value 516 from the set of values $B_0, B_1, B_2, \ldots, B_{N-1}$; and $D_x$ is the corresponding resulting modified digital value 518.

Similar to the above, the second occurrence of a digital value 516 would be calculated according to Equation 2, which is shown below.

$$D_x = \frac{(2^{M-1} - pcab)}{2^{M-1}} \times B_x - \Delta d \qquad \text{Equation 2}$$

Similar to Equation 1, Equation 2 assumes an M-bit DAC (i.e., the DAC 504 is an M-bit DAC); $B_x$ is the $x^{th}$ digital signal value 516 from the set of values $B_0, B_1, B_2, \ldots, B_{N-1}$; and $D_x$ is the corresponding resulting modified digital value 518.

Accordingly, on the basis of the above, a set of modified digital values 518 are generated using the set of perturbation values $+\Delta d$ and $-\Delta d$. The set of perturbation values $+\Delta d$ and $-\Delta d$ may be modified to calibrate the SAR ADC 508. For example, the calibration engine 510 may modify the set of perturbation values $+\Delta d$ and $-\Delta d$ over time based on the result test signals 522 received from the SAR ADC 508 such that the SAR ADC 508 can produce accurate conversion results. In one embodiment, the calibration engine 510 operates similarly or identically to the calibration engine 110. For example, the calibration engine 510 may operate with the SAR ADC 108 in a similar fashion as the digital calibration scheme 400 shown in FIG. 4.

Following generation, the set of modified digital values 518 are thereafter transferred/passed to the DAC 504 for conversion. The DAC 504 converts the modified digital values 518 from the digital domain 112 to the analog values 520 (sometimes referred to as analog test values 520) in the analog domain 114. The analog values 520 represent the original digital values 516 along with the applied set of perturbation values $+\Delta d$ and $-\Delta d$, which can be viewed as the analog perturbation values $+\Delta a$ and $-\Delta a$ now in the analog domain 114. Similar to the DAC 104, the DAC 504 may utilize various architectures and/or designs for performing digital-to-analog conversions. For example, the DAC 504 may be a pulse-width modulation (PWM) DAC, a binary-weighted DAC, an oversampling or interpolating (e.g., delta-sigma) DAC, an R-2R ladder DAC, a successive-approximation (or cyclic) DAC, a thermometer-coded DAC, etc. Digital-to-analog conversions by the DAC 504 may be achieved by adjusting a particular parameter (e.g., a voltage, a current, etc.) based on input binary data.

The analog values 520 are thereafter transferred/passed to the SAR ADC 508 for conversion. In particular, the SAR ADC 508 converts the analog values 520 to test result signals 522 (sometimes referred to as test result values 522), which are digital values that are based on the original set of digital test values 516 and corresponding set of perturbation values $+\Delta d$ and $-\Delta d$. As discussed above in relation to FIG. 2, the SAR ADC 508 may use a set of capacitors to convert the analog values 520 to test result signals 522 using a binary search. The calibration engine 510 may adjust the set of perturbation values $+\Delta d$ and $-\Delta d$ to account for inaccuracies by the SAR ADC 508, including inaccuracies caused by capacitor mismatch in the SAR ADC 508. In one embodiment, the calibration engine 510 may adjust the set of perturbation values $+\Delta d$ and $-\Delta d$ based on the digital calibration scheme 400 shown in FIG. 4.

As described above, the ADC calibration system 500 applies and adjusts perturbation values to account for accuracy issues in the SAR ADC 508. The architecture has the effect of (1) limiting/reducing the number of hardware elements needed to be provided in the calibration system 500 as instead digital circuits are utilized (e.g., the signal generator 502), (2) reducing corresponding cost of the calibration system 500 by reducing circuit elements, and (3) increasing the degree of granularity for adjustment of the perturbation values and corresponding SAR ADC 508 through the use of digital perturbation values $+\Delta d$ and $-\Delta d$, which have a finer granularity. In this fashion, the ADC calibration system 500 can calibrate and account for issues in the SAR ADC 508, including capacitor mismatch issues of the SAR ADC 508.

Figure 6:
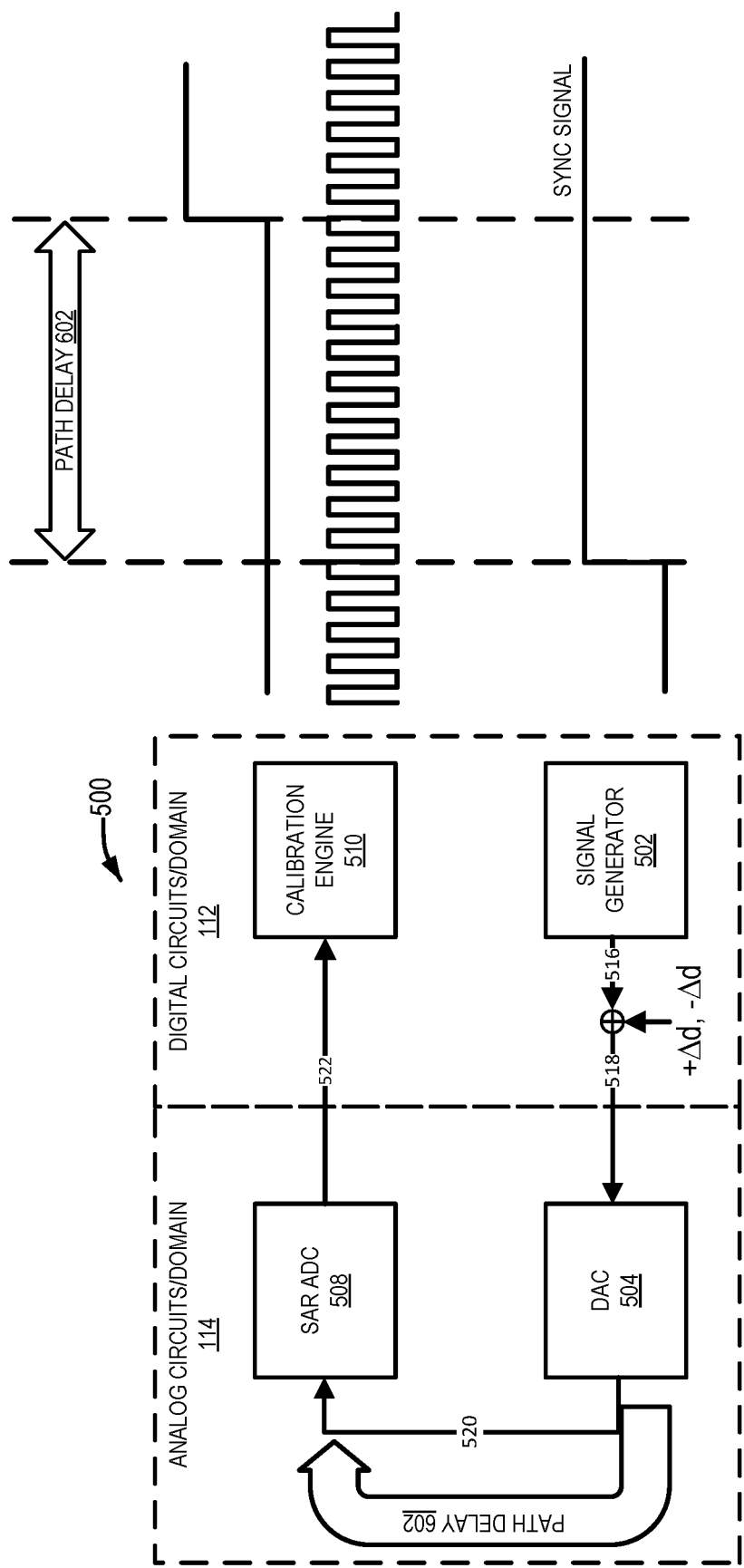
FIG. 6 shows an analog delay in an ADC calibration system, in accordance with some embodiments of the present disclosure.

In some embodiments, the ADC calibration system 500 can account for analog delay in the system 500 by estimating the analog delay and adding a corresponding guard interval to the digital test values 516. For example, FIG. 6 shows the ADC calibration system 500 that can calculate an analog delay 602. In one embodiment, the analog delay 602 may be calculated as the delay between signals leaving the DAC 504 and being received by the SAR ADC 508. As shown in FIG. 6, the analog delay 602 is calculated as the number of clock cycles between the analog values 520 leaving the DAC 504 and arriving at the SAR ADC 508.

Figure 7:
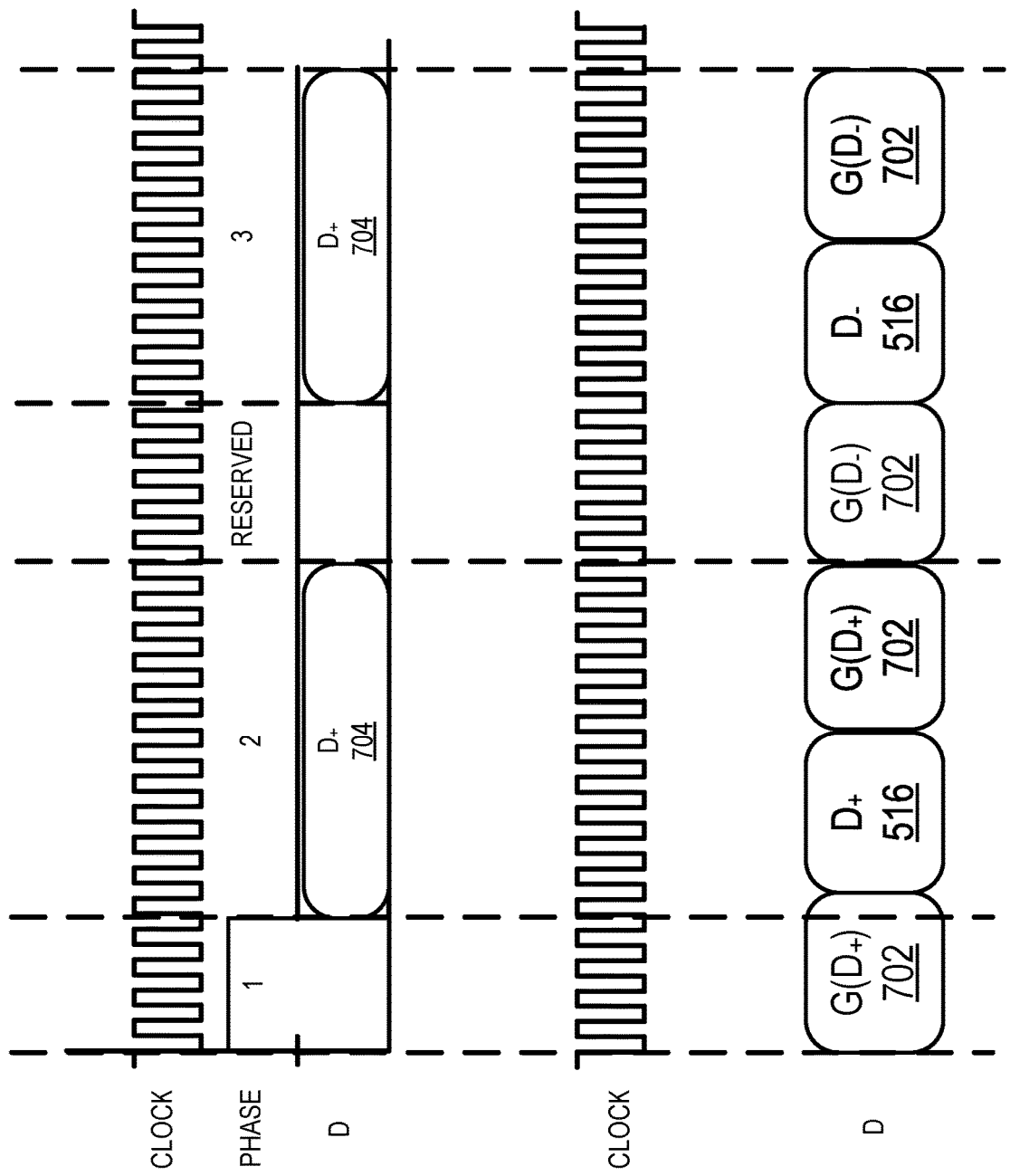
FIG. 7 shows a guard interval added to a digital value to account for analog delay in an ADC calibration system, in accordance with some embodiments of the present disclosure.

In one embodiment, the calibration engine 510 may estimate the analog delay 602 by measuring the time the analog values 520 propagate through the system 500. The calibration engine 510 may thereafter cause the signal generator 502 to add to each value 516 a corresponding set of guard intervals. For example, FIG. 7 shows a guard interval 702 added to each digital value 516 to arrive at corresponding delayed signal values 704. In some embodiments, each guard interval 702 is the same length as the determined analog delay 602 while in other embodiments the guard interval 702 may be greater in length than the analog delay 602. For example, a margin time value may be added to the analog delay 602 to arrive at the length of the guard interval 702. For instance, the margin time value may be a predefined time (e.g., 1 microseconds) or a predefined percentage of the analog delay 602 (e.g., the analog delay 602 is increased by 10%). In some embodiments, the digital perturbation values +Δd and −Δd are not applied to the guard intervals 702 and are only applied to each digital value 516.

Figure 8:
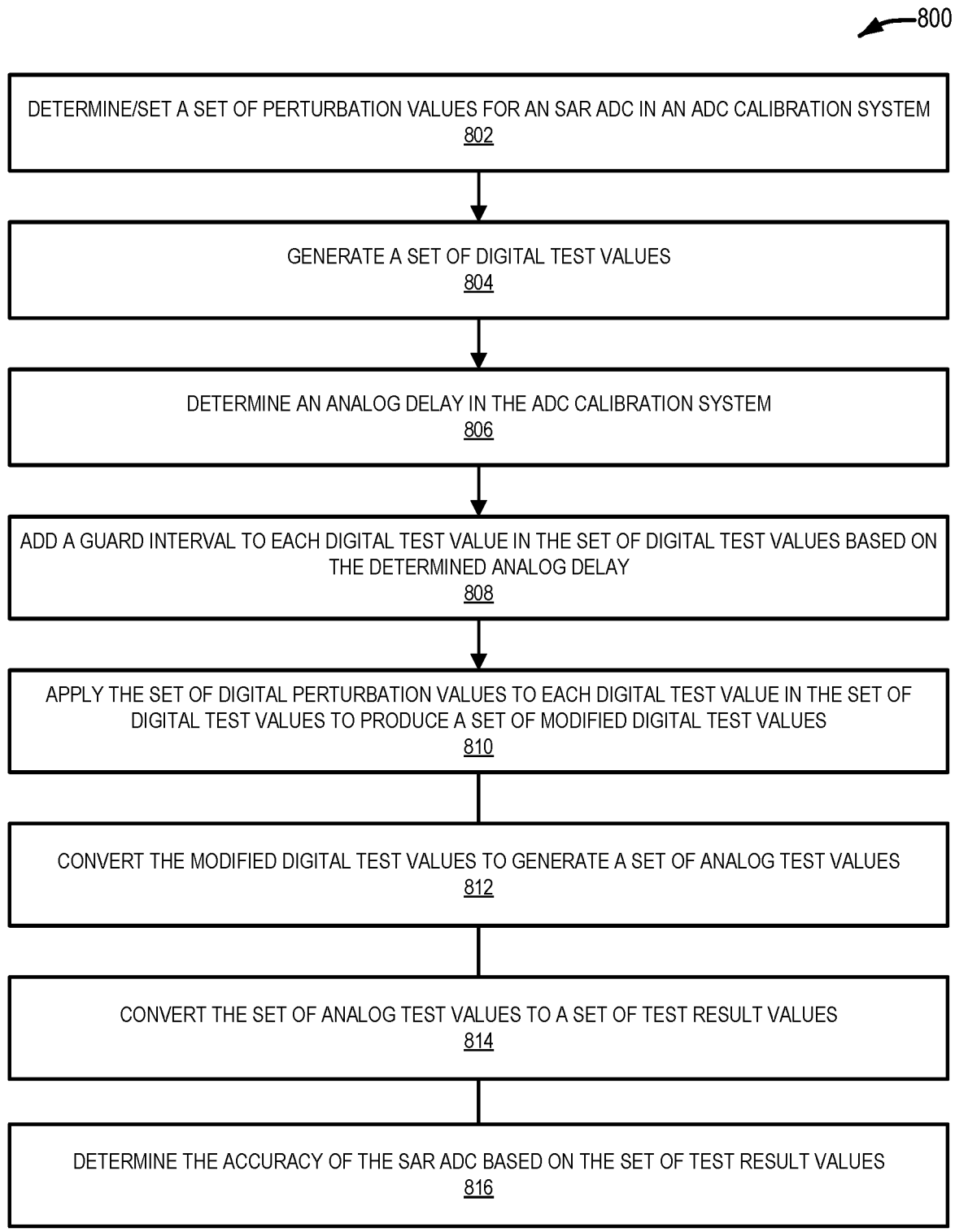
FIG. 8 shows a calibration method performed by a calibration system for calibrating a SAR ADC, in accordance with some embodiments of the present disclosure.

Turning now to FIG. 8, a method 800 will be described for testing and calibrating the SAR ADC 508, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by one or more components/circuits of the ADC calibration system 500. Although shown in a particular sequence or order, unless otherwise specified, the order of the processes/operations can be modified. Thus, the illustrated embodiments should be understood only as examples, and the illustrated processes/operations can be performed in a different order, and some processes/operations can be performed in parallel. Additionally, one or more processes/operations can be omitted in various embodiments. Thus, not all processes/operations are required in every embodiment. Other flows are possible.

As shown in FIG. 8, the method 800 may commence at operation 802 with the ADC calibration system 500 determining/setting a set of perturbation values. For example, the set of perturbation values may be the digital perturbation values +Δd and −Δd that can be used for configuring an analog-to-digital converter. In particular, the digital perturbation values +Δd and −Δd may used for configuring the SAR ADC 508. In one embodiment, the digital perturbation values +Δd and −Δd are initially set by the calibration engine 510 to a first or default value and may be changed by the calibration engine 510 based on feedback from components of the ADC calibration system 500. In some embodiments, the set of perturbation values can be considered a single value Δd that will either be added (+Δd) or subtracted (−Δd) from other values (e.g., digital test values 516) as will be described in greater detail below.

At operation 804, the signal generator 502 may generate a set of digital test values 516. As noted above, the set of digital test values 516 may be random or pseudo-random values that are used for testing the accuracy of the SAR ADC 508.

At operation 806, the ADC calibration system 500 may determine an analog delay 602 in the ADC calibration system 500. In one embodiment, the analog delay 602 may be calculated as the delay between signals leaving the DAC 504 and being received by the SAR ADC 508. Further, the analog delay 602 may be calculated based on a synchronization signal that is transferred between the DAC 504 and the SAR ADC 508 for measuring signal propagation between the DAC 504 and the SAR ADC 508.

At operation 808, the ADC calibration system 500 may add a guard interval 702 to each digital test value 516 in the set of digital test values 516 based on the determined analog delay 602. In particular, as shown in FIG. 7, a guard interval 702 may be added to the start/front and end/back each digital value to extend the length of the digital test values 516 and account for the analog delay 602 in the ADC calibration system 500.

At operation 810, the set of digital perturbation values +Δd and −Δd are applied to each digital test value 516 in the set of digital test values to produce a set of modified test values 518. In embodiments in which guard intervals 702 are employed, the set of digital perturbation values +Δd and −Δd are only applied to the original digital test values 516 and not necessarily to the guard intervals 702.

In some embodiments, the set of digital test values 516 include copies of each digital test value 516 such that the set of digital test values 516 include pairs of identical digital test values 516. In these embodiments, applying the set of digital perturbation values +Δd and −Δd includes (1) adding a perturbation value Δd from the set of perturbation values to a first digital test value 516 in each pair of identical digital test values 516 to produce a first modified digital test value 518 for the pair of identical digital test values 516 and (2) subtracting the perturbation value Δd from a second digital test value 516 in each pair of identical digital test values 516 to produce a second modified digital test value 518 for the pair of identical digital test values 516.

At operation 812, the DAC 504 converts the modified digital test values 518 to generate a set of analog test values 520.

At operation 814, the SAR ADC 508 converts the analog values 520 to a set of test result values 522.

At operation 816, the calibration engine 510 determines the accuracy of the SAR ADC 508 based on the set of test result values 522. In particular, the calibration engine 510 may compare the set of test result values 522 with the original digital test values 516 to determine the accuracy of the SAR ADC 508. Upon determining that the SAR ADC 508 is not accurately performing analog-to-digital conversions (e.g., the set of test result values 522 are not the same as the digital test values 516), the calibration engine 510 may adjust the set of digital perturbation values +Δd and −Δd (e.g., at operation 802) and continue to perform one or more of the operations 804-816 to determine and calibrate the accuracy of the SAR ADC 508.

Many of the solutions and techniques provided herein may be utilized in devices operating with a wireless local area network (WLAN) system. However, it should be understood that these solutions and techniques are also applicable to other systems, including other network environments, such as cellular telecommunication networks, wired networks, etc. In some embodiments, the solutions and techniques provided herein may be or may be embodied in an article of manufacture in which a non-transitory machine-readable medium (such as microelectronic memory) has stored thereon instructions which program one or more data processing components (generically referred to here as a "processor" or "processing unit") to perform the operations described herein. In other embodiments, some of these operations might be performed by specific hardware components that contain hardwired logic (e.g., dedicated digital filter blocks and state machines). Those operations might alternatively be performed by any combination of programmed data processing components and fixed hardwired circuit components.

In some cases, an embodiment may be incorporated within or may be an apparatus (e.g., an access point (AP) station (STA), a non-AP STA, or another network or computing device) that includes one or more hardware and software logic structures for performing one or more of the operations described herein. For example, as described herein, an apparatus may include a memory unit, which stores instructions that may be executed by a hardware processor installed in the apparatus. The apparatus may also include one or more other hardware or software elements, including a network interface, a display device, etc.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system may carry out the computer-implemented methods described herein in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method performed by a calibration system, the method comprising:
    determining a set of perturbation values for configuring an analog-to-digital converter of the calibration system;
    generating a set of digital test values for determining the accuracy of the analog-to-digital converter; and
    applying the set of perturbation values to the set of digital test values to generate a set of modified test values,
    wherein the set of perturbation values are digital values that are applied to the set of digital test values in the digital domain, and
    wherein the set of digital test values includes copies of each digital test value such that the set of digital test values includes pairs of identical digital test values.

2. The method of claim 1, further comprising:
    converting, by a digital-to-analog converter of the calibration system, the set of modified test values to generate a set of analog test values;
    converting, by the analog-to-digital converter, the set of analog test values to a set of test result values; and
    determining the accuracy of the analog-to-digital converter based on the set of test result values.

3. The method of claim 1, wherein the analog-to-digital converter is a successive approximation register (SAR) analog-to-digital converter.

4. The method of claim 1, further comprising:
determining an analog delay in the calibration system; and
adding a guard interval, based on the analog delay, to each digital test value in the set of digital test values to account for the analog delay in the calibration system.

5. The method of claim 4, wherein a guard interval is added to a start of each digital test value in the set of digital test values and to an end of each digital test value in the set of digital test values.

6. The method of claim 1, wherein applying the set of perturbation values to the set of digital test values to generate the set of modified test values comprises:
adding a perturbation value from the set of perturbation values to a first digital test value in each pair of identical digital test values; and
subtracting the perturbation from a second digital test value in each pair of identical digital test values.

7. A calibration device comprising:
an analog-to-digital converter;
a processing unit; and
a set of memory units that store instructions, which when executed by the processing unit cause the calibration device to:
determine a set of perturbation values for configuring the analog-to-digital converter,
generate a set of digital test values for determining the accuracy of the analog-to-digital converter, and
apply the set of perturbation values to the set of digital test values to generate a set of modified test values,
wherein the set of perturbation values are digital values that are applied to the set of digital test values in the digital domain, and
wherein the set of digital test values includes copies of each digital test value such that the set of digital test values includes pairs of identical digital test values.

8. The calibration device of claim 7, further comprising:
a digital-to-analog converter to convert the set of modified test values to generate a set of analog test values,
wherein the analog-to-digital converter is to covert the set of analog test values to a set of test result values; and
wherein the instructions, when executed by the processing unit, further cause the calibration device to determine the accuracy of the analog-to-digital converter based on the set of test result values.

9. The calibration device of claim 7, wherein the analog-to-digital converter is a successive approximation register (SAR) analog-to-digital converter.

10. The calibration device of claim 7, wherein the instructions, when executed by the processing unit, further cause the calibration device to:
determine an analog delay in the calibration system; and
add a guard interval, based on the analog delay, to each digital test value in the set of digital test values to account for the analog delay in the calibration system.

11. The calibration device of claim 10, wherein a guard interval is added to a start of each digital test value in the set of digital test values and to an end of each digital test value in the set of digital test values.

12. The calibration device of claim 7, wherein applying the set of perturbation values to the set of digital test values to generate the set of modified test values comprises:
adding a perturbation value from the set of perturbation values to a first digital test value in each pair of identical digital test values; and
subtracting the perturbation from a second digital test value in each pair of identical digital test values.

13. A non-transitory machine-readable storage medium, which stores instructions that when executed by a processor cause a device to:
determine a set of perturbation values for configuring an analog-to-digital converter;
generate a set of digital test values for determining the accuracy of the analog-to-digital converter; and
apply the set of perturbation values to the set of digital test values to generate a set of modified test values,
wherein the set of perturbation values are digital values that are applied to the set of digital test values in the digital domain, and
wherein the set of digital test values includes copies of each digital test value such that the set of digital test values includes pairs of identical digital test values.

14. The non-transitory machine-readable storage medium of claim 13, further comprising:
wherein a digital-to-analog converter of the device is to convert the set of modified test values to generate a set of analog test values;
wherein the analog-to-digital converter is to covert the set of analog test values to a set of test result values; and
wherein the instructions, when executed by the processor, further cause the device to determine the accuracy of the analog-to-digital converter based on the set of test result values.

15. The non-transitory machine-readable storage medium of claim 13, wherein the analog-to-digital converter is a successive approximation register (SAR) analog-to-digital converter.

16. The non-transitory machine-readable storage medium of claim 13, wherein the instructions, when executed by the processor, further cause the device to:
determine an analog delay in the device; and
add a guard interval, based on the analog delay, to each digital test value in the set of digital test values to account for the analog delay in the device.

17. The non-transitory machine-readable storage medium of claim 16, wherein a guard interval is added to a start of each digital test value in the set of digital test values and to an end of each digital test value in the set of digital test values.

18. The non-transitory machine-readable storage medium of claim 13, wherein applying the set of perturbation values to the set of digital test values to generate the set of modified test values comprises:
adding a perturbation value from the set of perturbation values to a first digital test value in each pair of identical digital test values; and
subtracting the perturbation from a second digital test value in each pair of identical digital test values.

* * * * *